(12) United States Patent
Meirelles Tomanik

(10) Patent No.: US 10,006,545 B2
(45) Date of Patent: Jun. 26, 2018

(54) RUNNING SET, PISTON BUSHING AND ENGINE BLOCK

(71) Applicants: Mahle International GmbH, Stuttgart (DE); Mahle Metal Leve S/A, Jundiai-Sp (BR)

(72) Inventor: Antonio E. Meirelles Tomanik, Sao Paulo (BR)

(73) Assignees: Mahle International GmbH (DE); Mahle Metal Leve S/A (BR)

( * ) Notice: Subject to any disclaimer, the term of this patent is extended or adjusted under 35 U.S.C. 154(b) by 106 days.

(21) Appl. No.: 14/890,102

(22) PCT Filed: May 9, 2014

(86) PCT No.: PCT/EP2014/059560
§ 371 (c)(1),
(2) Date: Nov. 9, 2015

(87) PCT Pub. No.: WO2014/180985
PCT Pub. Date: Nov. 13, 2014

(65) Prior Publication Data
US 2016/0084379 A1 Mar. 24, 2016

(30) Foreign Application Priority Data

May 9, 2013 (BR) .................... 102013011586

(51) Int. Cl.
*F16J 9/26* (2006.01)
*F16J 10/04* (2006.01)
*C23C 14/06* (2006.01)

(52) U.S. Cl.
CPC ............. *F16J 9/26* (2013.01); *C23C 14/0641* (2013.01); *F16J 10/04* (2013.01)

(58) Field of Classification Search
CPC ........ F16J 9/26; F16J 10/04; F16J 9/20; F16J 1/04; F16J 9/00; F16J 9/22; F02F 1/004;
(Continued)

(56) References Cited

U.S. PATENT DOCUMENTS 6,139,022 A * 10/2000 Iwashita ................. C23C 16/26
277/442
7,142,310 B2 11/2006 Straehle
(Continued)

FOREIGN PATENT DOCUMENTS

BR PI1100176-3 4/2013
CN 102869906 A 1/2013
(Continued)

OTHER PUBLICATIONS

Machine translation of JP10213003A.*
(Continued)

*Primary Examiner* — Long T Tran
(74) *Attorney, Agent, or Firm* — Fishman Stewart PLLC

(57) ABSTRACT

A running set for an internal combustion engine may include at least one of a cylinder liner and an engine block including at least one integrated cylinder. The running set may further include at least one piston ring. The at least one piston ring may define an outer running face and the at least one of the cylinder line and the integrated cylinder may define an inner running face. At least one part of the outer running face may include a coating composed of a ceramic material. At least one part of the inner running face may include a proportion of less than three percent of a folded metal.

20 Claims, 2 Drawing Sheets

(58) Field of Classification Search
CPC ... F02F 2001/006; F02F 11/005; F02F 7/0087
See application file for complete search history.

(56) References Cited

U.S. PATENT DOCUMENTS

| | | | |
|---|---|---|---|
| 7,267,344 B2* | 9/2007 | Fischer | C23C 14/0641 |
| | | | 277/442 |
| 7,543,557 B2 | 6/2009 | Wang | |
| 7,717,079 B2* | 5/2010 | Yamamura | F02F 1/20 |
| | | | 123/193.4 |
| 7,891,669 B2* | 2/2011 | Araujo | C23C 14/0036 |
| | | | 204/192.15 |
| 2007/0234994 A1* | 10/2007 | Wang | F02F 1/18 |
| | | | 123/193.1 |
| 2008/0136116 A1* | 6/2008 | Sarabanda | C23C 14/025 |
| | | | 277/443 |
| 2009/0026712 A1* | 1/2009 | Kawanishi | F16J 9/26 |
| | | | 277/443 |
| 2010/0319647 A1* | 12/2010 | Ogawa | C22C 21/00 |
| | | | 123/193.2 |
| 2011/0148047 A1* | 6/2011 | Araujo | C23C 14/0641 |
| | | | 277/443 |
| 2013/0221621 A1 | 8/2013 | Araujo | |
| 2013/0241154 A1* | 9/2013 | Shim | F16J 9/26 |
| | | | 277/442 |

FOREIGN PATENT DOCUMENTS

| | | |
|---|---|---|
| DE | 10302055 A1 | 8/2004 |
| DE | 102005023212 A1 | 11/2006 |
| DE | 102007008604 A1 | 8/2008 |
| EP | 2518373 A1 | 10/2012 |
| JP | 10213003 A * | 8/1998 |

OTHER PUBLICATIONS

Chinese Office Action, Pat. App. No. 201480024291.6, dated Jul. 5, 2016.
English abstract for DE-102005023212.
English abstract for DE-102007008604.
English abstract for BR-PI1100176-3.
Dimkovski, et al. "Quantification of the cold worked material inside the deep honing grooves on cylinder liner surfaces and its effect on wear", Elsevier Sequoia, Lausanne, CH, Bd. 267, Dec. 2009.
EP office Action for EP-14725402.3, dated Feb. 3, 2017.

* cited by examiner

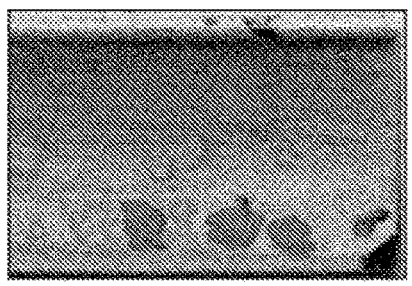
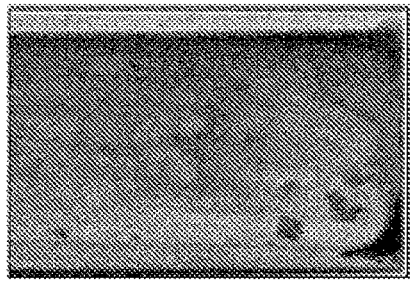
Fig. 3  Fig. 5
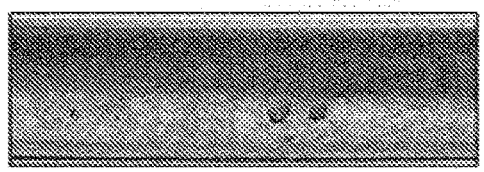
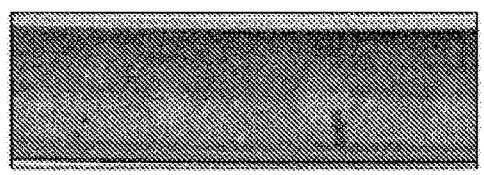
Fig. 4  Fig. 6
| Spalling (ring of the first groove) | | | | | | | | | | |
|---|---|---|---|---|---|---|---|---|---|---|
| Normal proportion of folded metal | | | | | | Low proportion of folded metal | | | | |
| Cil. N° | 0° | 90° | 180° | 270° | 360° | Cil. N° | 0° | 90° | 180° | 270° | 360° |
| 1 | ■ | | | ■ | | 1 | | | | | |
| 2 | ■ | | ■ | | ■ | 2 | ■ | | | ■ | |
| 3 | | | | | | 3 | | | | | |
| 4 | ■ | | | | | 4 | ■ | | | | |
| 5 | ■ | | | ■ | | 5 | | | | | ■ |
| 6 | ■ | | | | ■ | 6 | | | | | |
Fig. 7

RUNNING SET, PISTON BUSHING AND ENGINE BLOCK

CROSS REFERENCE TO RELATED APPLICATIONS

This application claims priority to Brazilian Patent Application No. 102013011586.0, filed May 9, 2013, and International Patent Application No. PCT/EP2014/059560, filed May 9, 2014, both of which are hereby incorporated by reference in their entirety.

TECHNICAL FIELD

The present invention relates to a running set consisting of at least one piston ring and at least one cylinder liner or a cylinder as a constituent part of an engine block (integrated cylinder), at least one part of the running face which is defined by the liner or the cylinder having a proportion lying below 3% of folded metal.

BACKGROUND

During the end phase of the production of the cylinder liner or the cylinder which is integrated into the block of an internal combustion engine, the inner running face is subjected to what is known as honing or burnishing, to be precise with the aim of achieving such properties as the appropriate coefficient of roughness and thus to make correct functioning possible during many operating hours with high performance and a low combustion quantity of the lubricating oil.

During the honing or burnishing, a certain amount of folded metal accrues on the treated surface, which is disadvantageous, since it can lead to spalling of the coating which is applied to the outer running face of the piston ring, in particular if it is a ceramic coating which is applied with the aid of the PVD method (physical vapor deposition). If the spalling of the coating reaches a certain proportion, this leads to a reduction in the service life of the internal combustion engine, since the ring begins to wear through its support material, which also leads to damage of the combustion chamber seal.

One solution to increase the durability of the coatings on engine components (engine block or liners, fixed or removable), provided with at least one cylinder and consisting substantially of iron, is specified in document PI 1100176-3 by the same applicant, in which document the components are provided with a coating which is divided into three different layers which are applied on a metal substrate, wherein a first layer consists of pure silicon which is applied on the substrate and has the function of forming an interface with satisfactory adhesion between the metal substrate and the following layers which contain amorphous carbon, a transition layer contains components of silicon and amorphous carbon (a-C:H:Si), and finally a second layer on the working face consists of a pure composition of amorphous carbon (a-C:H), said coating being produced via the hollow cathode effect (HCE) by means of plasma-enhanced chemical vapor deposition (PECVD).

One alternative consists in using cylinder liners/cylinders with a thermospray coating, but this type of coating requires very much higher implementation costs, also on account of the greater layer thickness of the material which is used. In addition, this type of coating is not possible without a study which also incorporates the coating type of the piston rings with regard to the maximization of the results regarding the durability.

German patent document DE 102007008604 relates to a method for assessing honed structures, such as the running face of a liner/a cylinder, which makes it possible to quantify the proportion of folded metal, it being possible for the existing proportion to be examined and to be related to the spalling of the coating on the piston rings, and also other properties which it is desired to examine and which are linked thereto.

German patent document DE 10302055 relates to a white light interferometer which makes it possible, under the influence of an optical or magnetic field, to perform the in-depth scanning of an object, with the result that the presence and the proportions of folded metal on the inner running face of a liner/a cylinder can be determined.

Finally, German patent document DE 102005023212 relates to a method for increasing the measuring speed and measuring accuracy, which method makes more accurate measuring of the objects possible.

The presence of this type of measuring technology has made it possible for the applicant to very accurately examine the percentage quantification of the proportion of folded metal in burnished structures; it was possible to examine the existing proportion and to relate it to the spalling of the coating on the piston rings, and also other properties which the applicant desired to examine and which are linked thereto, to be precise with the aid of parameters in conjunction with the product development, such as performance, durability and costs.

SUMMARY

Described in essential terms, the present invention is based on the object of providing a combination between a piston ring, the outer running face of which is provided with a coating which is applied with the aid of the PVD method (physical vapor deposition), and an inner running face of a liner or a cylinder with a low proportion of folded metal.

More precisely, the present invention is based on the object of providing a running set consisting of at least one piston ring and at least one cylinder liner or a cylinder as constituent part of an engine block (integrated cylinder), in which running set at least one part of the running face which is defined by the liner or the cylinder has a ceramic coating and at least one part of the inner running face of the liner/the cylinder has a proportion lying below 3% of folded metal.

Furthermore, the present invention is based on the object of providing a cylinder liner, in which at least one part of the running face which is defined by the ring has a ceramic coating and at least one part of the inner running face of the liner/the cylinder has a proportion lying below 3% of folded metal.

Finally, the present invention is based on the object of providing an engine block with at least one integrated cylinder, in which engine block at least one part of the running face which is defined by the ring has a ceramic coating and at least one part of the inner running face of the liner/the cylinder has a proportion lying below 3% of folded metal.

The objects of the present invention are achieved by way of a running set for use in an internal combustion engine, comprising at least one cylinder liner or an engine block with at least one integrated cylinder and at least one piston ring, the ring defining an outer running face and the liner/the integrated cylinder defining an inner running face, the outer running face of the ring interacting slidingly with the inner running face of the liner/the integrated cylinder, at least one part of the outer running face of the ring having a coating which consists of ceramic material, and at least one part of the inner running face of the liner/the integrated cylinder having a proportion lying below 3% of folded metal.

Furthermore, the objects of the present invention are achieved by way of a cylinder liner which is intended, in particular, for use in an internal combustion engine and which defines an inner running face, in which at least one part has a proportion lying below 3% of folded metal.

Furthermore, the objects of the present invention are achieved by way of an engine block having at least one integrated cylinder which defines an inner running face, in which at least one part has a proportion lying below 3% of folded metal.

BRIEF DESCRIPTION OF THE DRAWINGS

In the following text, the invention will be described in greater detail using exemplary embodiments with reference to the drawings, in which:

FIG. 3—shows an enlarged view of the upper section of the contact area of a ring of the first groove after operation in a liner/a cylinder, the inner running face of which ring has a normal proportion, standard proportion or controlled proportion of folded metal.

FIG. 4—shows an enlarged view of the middle section of the contact area of a ring of the first groove after operation in a liner/a cylinder, the inner running face of which ring has a normal proportion, standard proportion or controlled proportion of folded metal.

FIG. 5—shows an enlarged view of the upper section of the contact area of a ring of the first groove after operation in a liner/a cylinder, the inner running face of which ring has a proportion lying below 3% of folded metal (present invention).

FIG. 6—shows an enlarged view of the middle section of the contact area of a ring of the first groove after operation in a liner/a cylinder, the inner running face of which ring has a proportion lying below 3% of folded metal (present invention).

FIG. 7—shows a table which illustrates the spalling on the piston ring with PVD coating, to be precise (i) during operation in a liner/a cylinder, the inner running face of which has a high proportion of folded metal, and (ii) during operation in a liner/a cylinder, the inner running face of which has a proportion lying below 3% of folded metal (present invention).

DETAILED DESCRIPTION

Figure 1:
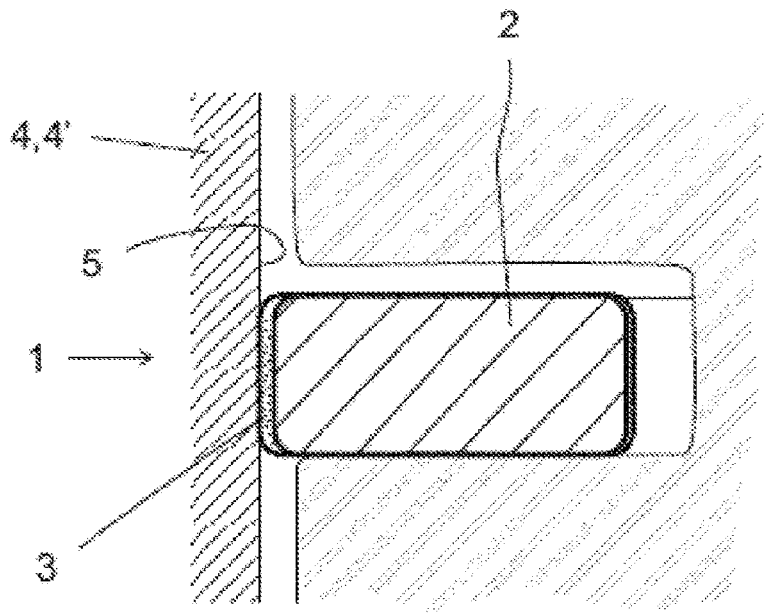
FIG. 1—shows a diagrammatic view of the running set which forms the subject matter of the invention.

The present invention relates substantially to the combination, in a running set for use in an internal combustion engine, of a piston ring, the outer running face of which is provided with a ceramic coating which is applied with the aid of the PVD method (physical vapor deposition), and an inner running face of a liner or a cylinder with a small proportion of folded metal.

The running set comprises substantially a cylinder liner 4 or an engine block with at least one integrated cylinder 4' and at least one piston ring 2. The ring 2 defines an outer running face 3, and the liner/the integrated cylinder 4, 4' defines an inner running face 5, and the outer running face 3 of the ring 2 interacts slidingly with the inner running face 5 of the liner/the integrated cylinder 4, 4'.

In any case, the ring of the first groove does not form the main object of the present invention, and its shape and its composition can be varied freely as long as its outer running face 3 is provided with a ceramic coating which has been applied with the aid of physical vapor deposition (PVD).

Although the coating can be varied freely in theory, a ceramic coating which is applied by way of the PVD method has a series of properties which affords advantages for many applications in comparison with other types of coatings or surface treatments and/or other application methods. However, it is also most sensitive with regard to spalling.

More precisely, the ceramic coating which is applied to the ring 2 is a coating comprising chromium nitride (CrN); the composition of said ceramic material can vary, however, without the invention departing from the scope of protection of the patent claims. As an alternative, a coating comprising chromium nitride ($Cr_2N$), niobium nitride (NbN) or else another necessary or desirable ceramic can be used.

As far as the cylinder liner 4 or the cylinder which is integrated into the engine block 4' is concerned, both running faces 5 can have different properties, without departing from the scope of protection of the patent claims. As has already been mentioned above, the inner running face 5 is subjected to honing or burnishing during the production process of the part, with the result that its efficient function is ensured for many operating hours with high performance and a low combustion quantity of the lubricating oil.

The technicians active in this field know, however, that a certain quantity of folded metal accrues during the honing or burnishing on the treated surface, which leads to spalling of the coating which is applied to the outer sliding face of the piston ring, in particular if it is a ceramic coating which is applied with the aid of the PVD method (physical vapor deposition).

If the spalling of the coating reaches a certain proportion, this leads to a reduction in the service life of the internal combustion engine, since the ring begins to wear through its support material, which also leads to damage of the combustion chamber seal.

Up to now, no thorough investigations have been carried out about the link between the proportion of folded metal and the spalling of the coatings on the rings; it is likewise not the case that there are investigations about whether the removal of the greatest part of said folded metal can be carried out and whether this would lead to an increase in the durability of the rings.

The approach used by the suppliers of the engine components has up to now led to the improvement of the ceramic layers applied by way of the PVD method and alternative solutions, in order that the performance of the engine was able to be maintained at the same level over a relatively long time.

By way of the present investigation and invention, the applicant has completely changed the paradigm for dealing with this type of spalling, which shows a high degree of innovation in research and the originality of the results achieved, since they had never before been investigated scientifically and were therefore unforeseeable or unexpected.

After various examinations and tests had been carried out, the applicant discovered that the proportional reduction of folded metal on the inner running face 5 causes a reduction in the spalling of the coating which is applied to the outer running face 3 of the ring, in particular in the case of the ceramic coatings which are usually used and are applied by way of PVD.

Figure 2:
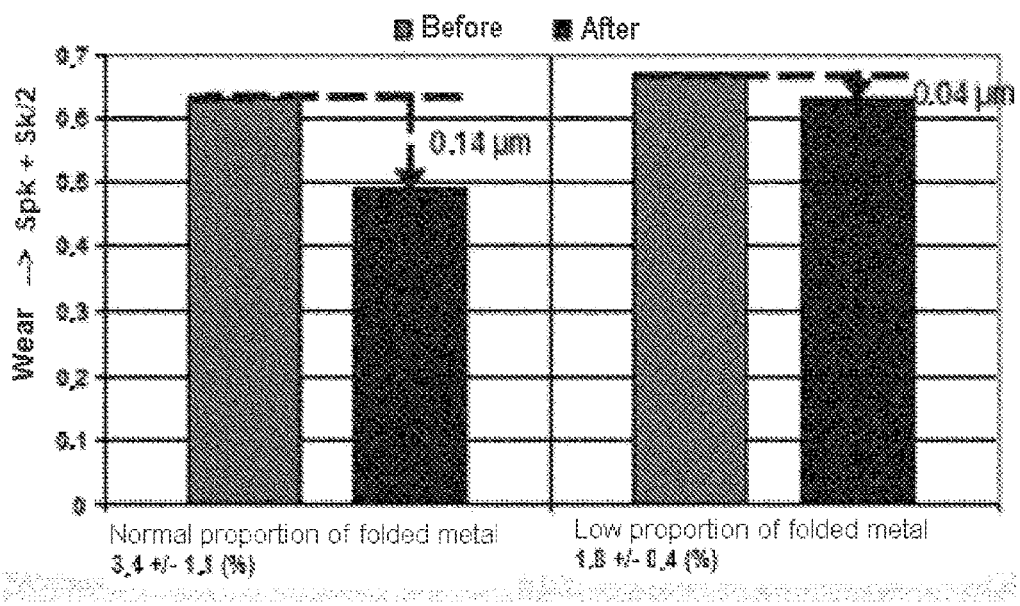
FIG. 2—shows a graphic for comparing the performance of the running set which forms the subject matter of the invention with a currently known running set.

FIG. 2 represents a composite graphic which illustrates a comparative test. The left-hand part of the graphic shows the results of the test of a piston ring with a ceramic coating comprising CrN, applied by way of PVD, in a liner/a cylinder, the inner face 5 of which has at least partially a proportion of folded metal of 4.4% (±1.1%), said value being considered to be a normal value, standard value or control value. It was determined after the test that the wear of the coating lay at 0.14 μm.

The right-hand part of the graphic shows the results of the test of an identical ring, under the same conditions, only that, in this case, the inner face 5 of the liner/the cylinder has at least partially a proportion of folded metal of 1.8% (±0.4%), said value being considered to be low. It was determined after the test that the wear of the coating lay at 0.04 μm.

Since the other variables were the same in both tests, the pronounced reduction in the wear (0.04 μm in comparison with 0.14 μm, less than one third) can be seen clearly.

This test was one of innumerable tests which were carried out, and it is largely representative in the determination that the reduction in the wear of the ring coating is substantial if the proportion of folded metal drops from approximately 4% to 2%.

After he had carried out a series of simulations and tests, the applicant thus arrived at the conclusion that the best properties are achieved if at least one part of the inner running face 5 of the liner/the integrated cylinder 4, 4' has a proportion lying below 3% of folded metal.

The comparison between FIGS. 3 and 5 very clearly shows the considerable reduction in the spalling (irregular darker cavities which represent "ripped-off" pieces of the coating) when the ring was tested in a liner/an integrated cylinder 4, 4' with a proportion of 1.8% folded metal (FIG. 5), in comparison with an identical ring where the latter was tested, however, in a liner/an integrated cylinder 4, 4' with a proportion of 4.4% of folded metal (FIG. 3).

In an analogous manner to this, a comparative analysis of FIGS. 4 and 6 shows the same reduction in spalling, but in the middle section of the contact area of a ring here and not in its upper section, where the loadings are more critical in nature.

Finally, the table in FIG. 7 shows a comparison between the spalling of the tested rings in a six-cylinder internal combustion engine, but under the aspect of the arrangement of said spalling distributed over the 360° format of the ring.

When the ring was tested in relation to a face 5 with a proportion considered to be a normal or control value of folded metal, spalling was determined on the rings of four of the six cylinders. When the test was repeated with the same engine and under identical conditions, with the exception of the proportion of folded metal (lower here), spalling was determined on only two rings, and the wear was substantially lower.

Finally, it is also to be emphasized that the present invention also comprises a cylinder liner 4 and an engine block separately from one another.

The cylinder liner 4 which forms the subject matter of the present invention is distinguished by the fact that it defines an inner running face 5, in which at least one part has a proportion lying below 3% of folded metal.

The engine block which forms the subject matter of the present invention and is provided with at least one integrated cylinder 4' is likewise distinguished by the fact that the cylinder 4' defines an inner running face 5, in which at least one part has a proportion lying below 3% of folded metal.

Regardless of the description of one preferred exemplary embodiment, the scope of the present invention includes other possible variations which are delimited only by the content of the associated patent claims, including possible equivalent variations.

The invention claimed is:

1. A running set for an internal combustion engine, comprising:
   at least one of a cylinder liner and an engine block including at least one integrated cylinder; and
   at least one piston ring;
   wherein the at least one piston ring defines an outer running face and the at least one of the cylinder liner and the integrated cylinder defines an inner running face, the outer running face interacting slidingly with the inner running face; and
   wherein at least one part of the outer running face includes a coating composed of a ceramic material, and at least one part of the inner running face has folded metal disposed on a surface of the inner running face, and wherein the at least one part of the inner running face has a proportion of less than 3% of folded metal on the surface.

2. The running set as claimed in claim 1, wherein the ceramic coating disposed on the at least one part of the outer running face consists of chromium nitride applied via physical vapor deposition (PVD).

3. The running set as claimed in claim 1, wherein the ceramic material includes at least one of chromium nitride and niobium nitride.

4. The running set as claimed in claim 1, wherein the coating is a physical vapor deposition ceramic coating.

5. The running set as claimed in claim 1, wherein the inner running face is provided by the cylinder liner.

6. The running set as claimed in claim 1, wherein the proportion of folded metal is below 2%.

7. The running set as claimed in claim 1, wherein the proportion of folded metal is 1.8%±0.4%.

8. The running set as claimed in claim 1, wherein the surface is a treated surface including at least one of honed structures and burnished structures on the inner running face.

9. The running set as claimed in claim 1, wherein the at least one part of the outer running face is in direct sliding contact with the at least one part of the inner running face during operation of the engine.

10. The running set as claimed in claim 9, wherein the ceramic material of the coating includes chromium nitride.

11. The running set as claimed in claim 9, wherein the ceramic material of the coating includes niobium nitride.

12. The running set as claimed in claim 1, wherein the inner running face is provided by the at least one integrated cylinder.

13. A cylinder liner for an internal combustion engine, comprising: an inner running face, wherein at least part of the inner running face includes a treated surface having a presence of folded metal, and wherein a proportion of folded metal on the treated surface is less than 3%.

14. The cylinder liner as claimed in claim 13, wherein the proportion of folded metal is 1.8%±0.4%.

15. The cylinder liner as claimed in claim 13, wherein the presence of folded metal accrued via at least one of honing and burnishing the inner running face.

16. The cylinder liner as claimed in claim 13, wherein the treated surface includes at least one of honed structures and burnished structures on the inner running face.

17. An engine block having at least one integrated cylinder, comprising: an inner running face provided with a treated surface and folded metal disposed on the treated surface, wherein the inner running face has a proportion of less than 3% of folded metal on the treated surface.

18. The engine block as claimed in claim 17, wherein the proportion of folded metal is less than 2%.

19. The engine block as claimed in claim 17, wherein the proportion of folded metal is 1.8%±0.4%.

20. The engine block as claimed in claim 17, wherein the treated surface includes at least one of honed structures and burnished structures.

* * * * *